United States Patent [19]
Beaver et al.

[11] 3,808,752
[45] May 7, 1974

[54] METHOD OF AUTOMATICALLY ADJUSTING THE FREQUENCY OF CRYSTAL RESONATORS

[75] Inventors: William D. Beaver, Mission Viejo; Herbert O. Lewis, Westminster, both of Calif.

[73] Assignee: Comtec Economation, Santa Ana, Calif.

[22] Filed: July 10, 1972

[21] Appl. No.: 270,051

[52] U.S. Cl. .................... 51/319, 29/25.35, 29/593, 51/14
[51] Int. Cl. .................... B24f 1/00
[58] Field of Search .......... 29/25.35, 593; 51/8, 14, 51/319, 320, 321

[56] References Cited

UNITED STATES PATENTS

| | | | |
|---|---|---|---|
| 2,023,494 | 12/1935 | Streiby | 29/25.35 |
| 2,345,648 | 4/1944 | Wolfskill | 51/8 |
| 3,534,503 | 10/1970 | Kulischenko | 51/8 |
| 2,877,338 | 3/1959 | Berge | 29/25.35 |
| 2,870,521 | 1/1959 | Rudnick | 29/25.35 |
| 3,702,042 | 11/1972 | Cochran et al. | 51/8 |
| 3,685,209 | 8/1972 | Lambert | 51/14 |

*Primary Examiner*—Charles W. Lanham
*Assistant Examiner*—Carl E. Hall
*Attorney, Agent, or Firm*—Smyth, Roston & Pavitt

[57] ABSTRACT

A method of tuning a mechanical resonator comprising reducing a dimension of the resonator to thereby change its resonant frequency, measuring the resonant frequency of the resonator while said dimension is being reduced, and controlling the dimension reduction in accordance with the frequency measurement to thereby provide the resonator with the desired resonant frequency.

13 Claims, 4 Drawing Figures

METHOD OF AUTOMATICALLY ADJUSTING THE FREQUENCY OF CRYSTAL RESONATORS

BACKGROUND OF THE INVENTION

Certain crystals such as quartz crystals have the ability to generate a voltage when a mechanical force is applied thereto. Conversely, such crystals also have the ability to deform when a voltage is applied to the crystal. These crystals are commonly referred to as piezoelectric crystals.

Piezoelectric crystals have highly stable frequency characteristics, and they are frequently used in a resonator for an oscillator. A typical resonator includes a crystal plate mounted on a header. The crystal plate includes a crystal blank of piezoelectric material such as quartz having electrodes suitably affixed to the opposite faces thereof. The crystal plate is mounted on the header in spaced relationship thereto in any suitable manner such as by electric lead wires.

It is very important to the accuracy of the device in which the resonator is to be used that the resonator be accurately tuned, i.e, that the resonant frequency of the resonator be accurately set. This can be accomplished by controlling the dimensions of the crystal plate. Dimensional control is usually achieved by reducing one or more dimensions typically the length of the crystal plate. The resonant frequency of the crystal plate is inversely proportional to certain of its dimensions, and for several types of resonators by reducing the length of the crystal plate, the resonant frequency of the crystal plate and of the resonator is increased. The length of the crystal plate is reduced to increase the frequency of the resonator, and the length reduction operation is carried out until the desired frequency is obtained.

Prior art processes for tuning resonators are generally too slow and not sufficiently accurate. For example, one prior art process includes manually rubbing a crystal plate against a sheet of abrasive paper, cleaning the crystal plate and then measuring the resonant frequency of the resonator. This process which is repeated until the resonator is on frequency is a trial and error process which requires considerable skilled labor and otherwise possesses the disadvantages noted above.

SUMMARY OF THE INVENTION

The present invention very substantially increases the speed of tuning mechanical resonators. For example, a machine constructed in accordance with the teachings of this invention increases the speed of tuning by a factor of approximately five to eight. Moreover, a single operator can operate two such machines. The present invention also very substantially increases the accuracy of the tuning operation.

The concepts of the present invention are applicable to the tuning of various mechanical resonators, the frequency of which is a function of one or more dimensions of the resonator. Although the invention is described with reference to a resonator of the type employing a piezoelectric crystal, it should be understood that this is merely exemplary of the kind of resonator which may be tuned utilizing the concepts of this invention.

With the present invention, the resonant frequency of a resonator is increased by reducing the length of the crystal plate while the instantaneous resonant frequency of the resonator is being simultaneously monitored. Thus, the length reduction operation is not interrupted by frequency measurement, and this is a substantial time saver. The length reduction operation is in turn automatically controlled by signals derived from the instantaneous resonant frequency of the resonator.

Because the crystals are usually very small, the length reduction operation must be very accurately carried out. In addition, length reduction must be carried out without rigidly clamping the crystal plate in a manner that would inhibit crystal plate vibration because this would prevent the taking of frequency readings simultaneously with the abrasion operation. These objectives can be obtained, at least in part, by using a stream of abrasive particles or powder to reduce crystal plate length. The crystal plate and the stream of abrasive particles are relatively advanced toward each other. When the abrasive strikes the crystal plate, it abrades the end of the crystal plate, and this reduces the length of the crystal plate. This manner of abrasively reducing the length of the crystal plate is fast, accurate and adaptable for use in production.

The electrodes attached to the crystal blank are typically very thin layers of vacuum deposited gold. It would be expected that subjecting of the crystal plate to the abrasive particles would tend to dampen its resonance and to destroy the thin gold electrodes. Surprisingly, the crystal plate can be advanced into the abrasive particles without either of these adverse effects occurring.

The crystal blank is typically in rectangular plate or elongated bar form and has a generally planar end face. It is desirable to retain this planar end face. To accomplish this, the stream of abrasive particles are preferably arranged to strike the planar end face at an acute angle whose magnitude depends on the thickness of the plate. If the stream of abrasive particles were to be directed against the crystal parallel to the end face, the crystal would be abraded so that the end face would not be planar or perpendicular to the longitudinal axis of the crystal.

Although dimensional reduction and frequency monitoring can be carried out simultaneously, if desired, the dimension reduction can be terminated for a short interval during which frequency is monitored. This provides additional accuracy for the frequency monitoring operation because it eliminates the loading of the resonator by the abrasive stream. Alternately the air flow from the abrasive supply can be reduced during the frequency measuring operation.

The length reduction operation is controlled by appropriate signals derived from the instantaneous resonant frequency of the resonator. The rate of advance of the crystal plate into the abrasive stream can advantageously be a function of the rate of change of the resonant frequency of the resonator. More specifically, the tuning operation can be controlled at a rate which is a percent of the difference between instantaneous frequency and desired frequency. In addition, the abrasiveness of the abrasive stream can be reduced as the frequency is approached. Of course, the length reduction operation is terminated when the desired frequency is reached.

The instantaneous resonant frequency of the resonator can be advantageously ascertained by a tuning oscillator, the oscillating frequency of which is controlled by the instantaneous resonant frequency of the resonator. A reference oscillator provides a fixed reference frequency representative of the desired resonant frequency of the resonator. The instantaneous frequency of the resonator and the reference frequency are combined to produce a combined frequency which can advantageously be the difference between these two frequencies. This information is processed electronically and utilized to control the rate of feeding of the resonator into the abrasive stream and the abrasiveness of the abrasive stream. This assures that the resonator will be tuned as rapidly as possible and reduces the danger of ruining the resonator by making the crystal plate too short. The frequency information is preferably processed repeatedly and rapidly such as several times a second.

In order to rapidly tune the resonator, it can advantageously be loaded into a workholder at a position remote from the abrasive stream and then very rapidly moved to a position closely adjacent, but out of, the abrasive stream. Next, a feed motor is energized to move the crystal plate into the abrasive stream at a controlled rate. When the system detects that the tuning rate of the resonator has reached a predetermined rate, the system is put into a servocontrol mode. In the servocontrol mode, the rate of advance of the crystal plate into the abrasive stream is carefully controlled, and if a predetermined rate of change of frequency of the resonator is detected, the feed motor is reversed to back the crystal away from the abrasive stream.

The invention can best be understood by reference to the following description taken in connection with the accompanying illustrative drawings.

DESCRIPTION OF THE PREFERRED EMBODIMENT

Figure 1A:
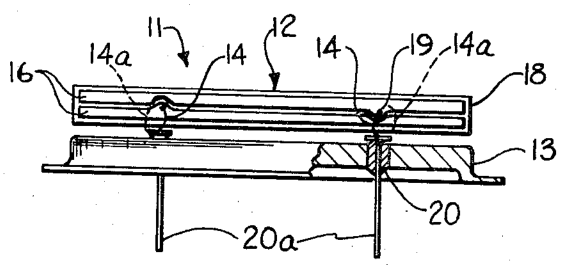
FIG. 1*a* is a side elevational view of the resonator.
Figure 1:
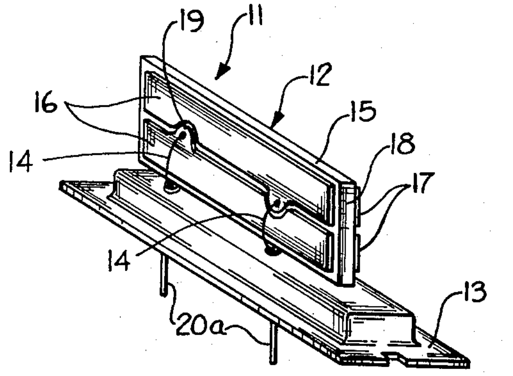
FIG. 1 is a perspective view of a typical piezoelectric resonator.

FIGS. 1 and 1*a* show a resonator 11 which includes a crystal plate 12, a header 13, and conductive leads 14 and **14*a* for attaching the crystal plate 12 to the header 13. The crystal plate 12 includes a crystal blank 15 of piezoelectric material such as quartz and electrodes 16 and 17 attached, respectively, on the opposite longitudinal faces of the crystal blank. In the embodiment illustrated, the crystal blank 15 is an elongated rectangular solid. The crystal blank 15 has a planar, rectangular end face 18 which is perpendicular to the longitudinal axis of the crystal blank 15. The electrodes 16 are arranged in spaced parallel relationship on one longitudinally extending face of the crystal blank 15, and the electrodes 17 are similarly arranged on the opposite face of the crystal blank. Each of the electrodes 16 and 17 is suitably attached to the crystal blank 15** and is constructed of a thin conductive metal such as gold.

Figure 3:
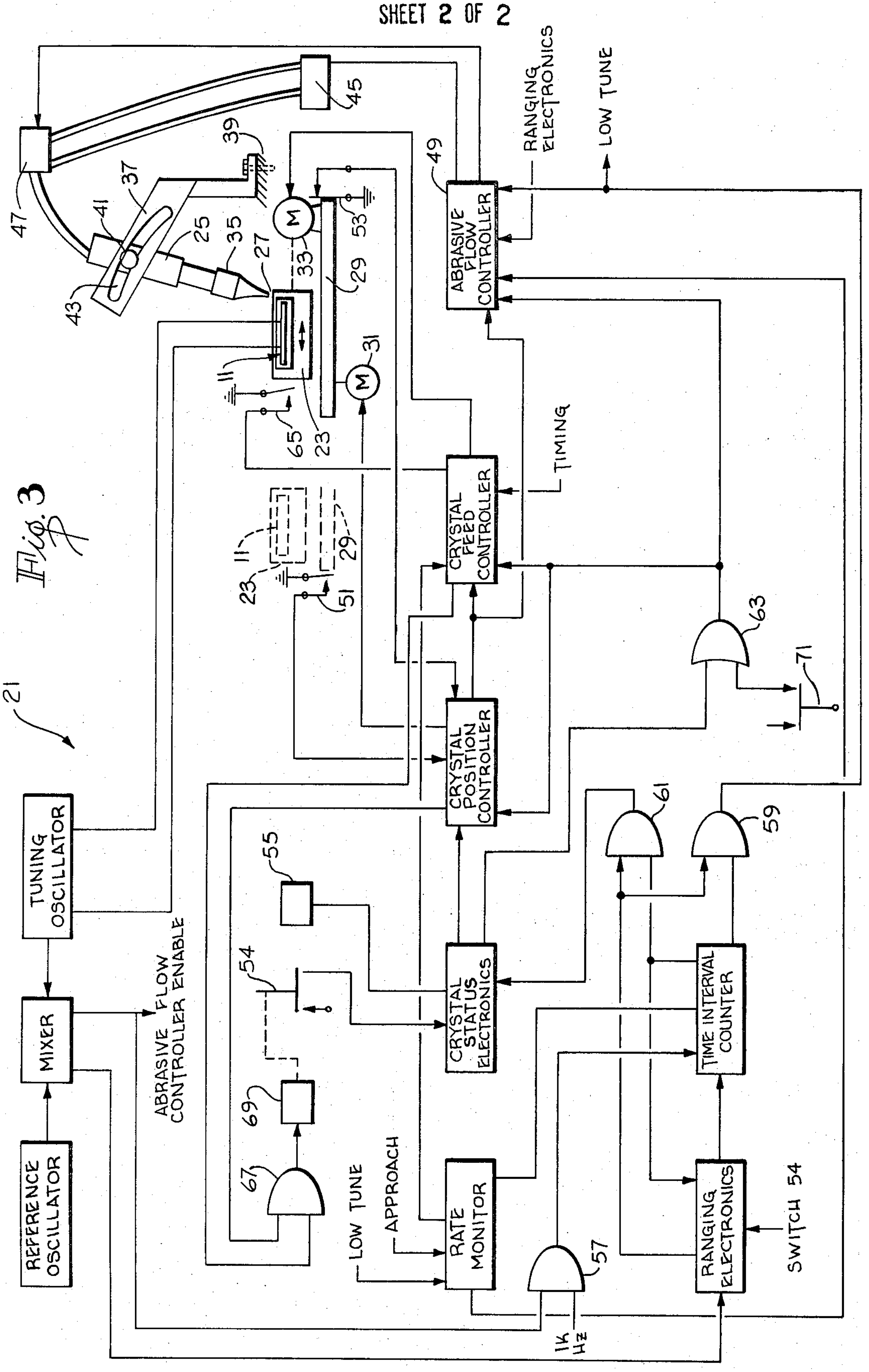
FIG. 3 is a schematic diagram showing in greater detail a preferred construction of the crystal tuner.

The conductive wire leads 14 and **14*a* support the crystal plate 15 on the header 13 in spaced relationship thereto and allow the crystal plate to vibrate. Each of the electrodes 16 and 17 has a projection 19 which is received within a correspondingly shaped recess of the adjacent electrode, and the leads 14 and 14*a* are connected to the associated electrodes at these projections. In the embodiment illustrated, the upper electrode 16 and the lower electrode 17 are connected by the leads 14 and 14*a* to an electrical connector 20 and the upper electrode 17 and the lower electrode 16 are similarly connected to another connector 20. A pair of leads 20*a* lead from the connectors 20 to a tuning oscillator (FIG. 3). Obviously the resonator 11** is merely one example of a resonator which can be tuned with the apparatus and method of this invention.

The resonator 11 can be tuned by reducing the width or length of the crystal blank 12 to thereby decrease or increase its resonant frequency. In some instances the length of the electrodes 16 and 17 will also be reduced. The crystal 11 is initially longer and has a lower resonant frequency than that which is desired.

Figure 2:
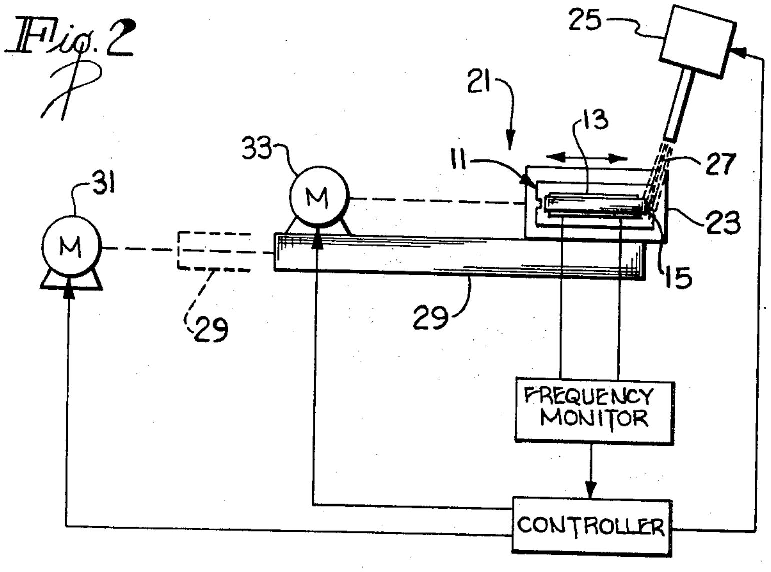
FIG. 2 is a simplified schematic diagram illustrating one form of crystal tuner contructed in accordance with the teachings of this invention.

According to the present invention, the tuning of the resonator 11 can be advantageously carried out with a frequency adjustment system 21 shown in FIG. 2. The frequency adjustment system 21 generally includes a mounting member or resonator holder 23 for mounting the resonator 11 and an abrasive supply 25 for directing an abrasive stream 27 comprising abrasive particles or powder in a fluid toward the end face 18. The resonator holder 23 mounts the resonator in any suitable manner which will allow the resonator and in particular the crystal plate 12 to vibrate in a resonant mode when the resonator is excited.

Abrasive supplies such as the abrasive supply 25 are known per se and one suitable for use in the frequency adjustment system 21 is known as an industrial abrasive unit and manufactured by S.S. White. The abrasive supply 25 discharges a fine abrasive powder in a fluid stream such as an air stream. The abrasive stream 27 is inclined at an acute angle relative to the end face 18. This is preferred in order to assure that the end face 18 will remain essentially flat and perpendicular to the longitudinal axis of the crystal blank 12. Although the specific angle formed by the abrasive stream 27 and the end face 18 can be varied, such angle is preferably in the range from greater than 0° to no more than 30°, with the exact angle depending on the crystal plate thickness.

It is important that the rate of length reduction and hence the rate of the resonant frequency increase be maintained at a controlled predetermined rate. If this is not done, the crystal blank 12 may be made too short and therefore give the resonator 11 a resonant frequency which is too great for the intended purpose. The present invention accomplishes length reduction control in two separate ways. First, length reduction control is provided by varying the rate of advance of the crystal blank 12 into the abrasive stream 27 as a function of the rate of change of the resonant frequency of the resonator 11. Secondly, control is further established by varying of the abrasiveness of the abrasive stream 27. Thus, for a high abrasiveness, the stream 27 contains more abrasive particles than for a low abrasiveness.

Either or both of the resonator 11 and the abrasive stream 27 may be moved in order to obtain the desired feed rate of the crystal into the abrasive stream. However, in a preferred embodiment, the abrasive stream 27 is fixed and the resonator 11 is mounted for reciprocating movement by the resonator holder 23 toward or away from the abrasive stream 27. The resonator holder 23 is mounted on a movable table 29. The table 29 can be rapidly moved from a loading position shown in dashed lines in FIG. 2 to a working position shown in full lines in FIG. 2. At the loading position, the resonator 11 is loaded into the resonator holder 23, and thereafter, the table 29 is moved by a positioning motor 31 rapidly to the working position. This roughly positions the resonator 11 adjacent to, but outside of, the abrasive stream 27.

Secondly, an incrementing feed motor 33 is energized at its maximum rate to move the resonator holder 23 and the end face 18 toward and into the abrasive stream 27. The feed motor 33 is a reversible electric motor which permits slowly advancing or slowly retracting the crystal plate 12 relative to the abrasive stream 27.

As the end face 15 is abraded and the length of the crystal plate 12 is reduced, a frequency monitor substantially continuously monitors the change in the instantaneous resonant frequency of the resonator 11 and provides a signal related thereto. This signal is fed to a controller which operates the motors 31 and 33 and controls the abrasive supply 25. Specifically, the controller causes the positioning motor 31 to be energized to move the resonator 11 to the working position and thereafter causes the incrementing feed motor 33 to be moved at its maximum rate to advance the end face 15 of the crystal plate 12 into the abrasive stream 27 at its maximum rate. During this time, the controller causes the supply 25 to discharge a highly abrasive stream 27. As the length of the crystal plate 12 is reduced, the frequency of the resonator is monitored by the frequency monitor and a signal related to the resonant frequency is supplied to the controller. When the rate of frequency change of the resonator 11 reaches a predetermined rate, the controller operates the motor 33 in a servocontrol mode, i.e., forward and reverse as may be necessary to maintain the desired rate of change of the frequency of the resonator 11. If a predetermined rate of frequency change is exceeded, the motor 33 is energized in the reverse direction so as to tend to withdraw the crystal plate 12 from the abrasive stream 27 until the rate of frequency increase is slowed so that it is less than the predetermined rate.

As the desired frequency of the resonator 11 is approached, the predetermined maximum rate of frequency increase is automatically reduced by the controller and the motor 33 is operated accordingly. This assures that, as the desired frequency is approached, even greater care will be taken to prevent increasing the frequency of the resonator above allowable tolerances. Also as the desired frequency of the resonator is approached, the controller causes the abrasive supply 45 to reduce in steps the abrasiveness of the abrasive stream 27.

The tuning rate can advantageously be controlled as a percent of the difference frequency ( $\Delta f_i$) per unit of time where $\Delta f_i$ equals a reference frequency ($f_r$) less the instantaneous frequency ($f_i$) of the resonator 11. The reference frequency $f_r$ may be the desired frequency to which the resonator is to be tuned. However, when the tuning rate is a percent of $\Delta f_i$, it is desirable to provide a frequency offset, for otherwise, the desired frequency could never be attained. Accordingly, $f_r$ equals the desired frequency ($f_d$) plus a fixed frequency offset such as 10 Hz. With the tuning rate controlled in this manner, there is substantial assurance that the resonator will not be tuned to a frequency which is higher than that desired.

Preferably the tuning rate is additionally adjusted during the tuning operation. For example, the tuning rate at which the controller shifts the motor 33 to a servocontrol mode may be, for example, 1 percent $\Delta f_i$ per unit of time. In the servocontrol mode, the allowable tuning rate may be, for example, 2 percent $\Delta f_i$ per unit of time until $\Delta f_i$ equals 30 Hz and thereafter the tuning rate may be 1 percent $\Delta f_i$ per unit of time until the desired frequency is attained. The unit of time may be a fractional part of a second such as 0.2 second. Also by way of example, the abrasiveness of the abrasive stream 27 may be relatively high until $\Delta f_i$ equals 400 Hz medium when $\Delta f_i$ is between 400 Hz and 14 Hz, and low when $\Delta f_i$ is below 14 Hz.

FIG. 3 shows the crystal tuner 21 in greater detail. It should be understood, however, that the concepts described with reference to FIG. 3 can be implemented in many different ways and that the construction shown in FIG. 3, although preferred, is merely illustrative.

In FIG. 3, the abrasive supply 25 includes a nozzle 35 mounted by a bracket 37 on supporting structure 39. The position of the nozzle 35 can be adjusted by means of a screw 41 and a slot 43 in the bracket 37. The abrasive supply 25 also includes an abrasive source 45, valves 47 which provide on/off control for the supply of air and abrasive to the nozzle 35, and an abrasive flow controller 49.

In response to the appropriate input signals described hereinbelow, the abrasive flow controller 49 provides two important functions. First, in response to start abrasion and stop abrasion signals, it opens and closes, respectively, the air valves 47. Second, it controls the flow rate of abrasive from the abrasive source 45 to the nozzle 35 as a function of the degree to which the resonator 11 has been tuned.

Although the three abrasive flow rates are indicated in FIG. 3, obviously a larger or smaller number could be employed. Although the valves 47 in the embodiment illustrated are air valves, obviously these valves could be controlled in any other suitable way.

The table 29 is movable between a load position in which it engages and closes a load position stop switch 51 and a tuning position in which it engages a tune position stop switch 53. In the load position, the resonator 11 is loaded into the resonator holder 23 as shown in dashed lines in FIG. 3. With the resonator 11 in the load position, a start switch 54 is closed to supply power to the system, and the status or initial frequency of the resonator is determined in a manner described more fully hereinbelow. If the initial frequency of the resonator 11 is too high, the crystal plate 12 is too short. In this event a crystal high light 55 is illustrated and the resonator 11 is then removed from the adjustment system 21. If the initial frequency of the resonator 11 is low, crystal status electronics provides a tune crystal signal, as described more fully hereinbelow, to a crystal position controller which energizes the positioning motor 31 in the forward direction to move the table 29 and the resonator holder 23 thereon to the tuning position. In the tuning position, the table 29 closes the limit switch 53, and this provides a signal to the crystal position controller which de-energizes the positioning motor 31.

With the table 29 in the tuning position, the crystal position controller provides a start abrasion signal to the abrasive flow controller 49 to initiate the abrasive stream 27. With the limit switch 53 closed, a signal is provided to the abrasive flow controller 49 by the position controller which causes the abrasive supply 25 to emit an abrasive stream 27 of high abrasiveness. The crystal position controller also provides a signal to the crystal feed controller which energizes the incrementing feed motor 33 in the forward direction at a fast controlled rate to thereby advance the resonator 11 toward and into the abrasive stream 27 at the controlled rate.

As the crystal plate 12 is advanced into the abrasive stream 27, its length is reduced and its frequency is increased. The frequency of the resonator 11 is substantially continuously monitored. To this end, the instantaneous oscillating frequency of a tuning oscillator is coupled to and controlled by the instantaneous frequency ($f_i$) of the resonator 11. This frequency information is transferred to a mixer. A reference oscillator provides the mixer with a signal representing a reference frequency $f_r$ which, as indicated above, is preferably offset from the desired frequency ($f_d$) by 10 Hz. The signals representing $f_i$ and $f_r$ may be, for example, in the form of sine waves. The output of the mixer is a signal which represents $f_r$-$f_i$ or the instantaneous difference frequency ($\Delta f_i$). The signal representing $\Delta f_i$ may be, for example, a square wave and is fed to ranging electronics which divides $\Delta f_i$ by a divisor $n$ where $n$ is selected to maintain the quotient equal to or greater than the amount of the frequency offset, which in this example is 10 Hz. The divisor n in the embodiment illustrated is 40, 10, 4 or 1.

The ranging electronics may include, for example, dividers one or more of which can be simultaneously selected to thereby provide the requisite divisor. In the embodiment illustrated, the ranging electronics includes two dividers having divisors of 4 and 10, respectively. When the start switch 54 is closed, a selector in the ranging electronics selects both of the dividers so that the resulting divisor is 40. It will be appreciated that by selecting one or more or none of the dividers all the above noted divisors can be obtained.

The ranging electronics also provides a signal representing the quotient of $\Delta f_i/n$ to a time interval counter. $\Delta f_i/n$ may be set equal to $1/t$ where $t$ represents time. The time interval counter counts a 1,000 Hz reference frequency for a time equal to $t$. As the frequency of the resonator 11 is increased, $\Delta f_i$ decreases and, therefore, $\Delta f_i/n$ decreases and $t$ increases. When $t$ increases to a preselected value such as 100 milliseconds, the time interval counter provides a down range signal to the ranging electronics whereupon the selector of the ranging electronics selects a different divider or dividers to thereby set n equal to the next lowest divisor on the scale. In the embodiment illustrated, the selector is responsive to the first down range signal to select the times 10 divider with the result that the divider is 10.

The result of reducing the divisor $n$ is to increase the quotient of $\Delta f_i/n$ and to decrease the time $t$ to less than the value which initiates the down range signal, i.e., to less than 100 milliseconds in the embodiment illustrated. The time interval counter continues the counting process as described above until $t$ again equals 100 milliseconds whereupon an additional down range signal is supplied to the ranging electronics to cause the latter to select the next lower divisor.

By way of example, the input signal to the time interval counter representing $\Delta f_i/n = 1/t$ may be in the form of a square wave with time being represented by the time between the leading edge of one square wave to the leading edge of the next square wave. The time interval counter is enabled every 0.2 second. Following the enabling of the time interval counter, the counter begins counting the 1,000 Hz signal for the time $t$ beginning with the leading edge of the next square wave which is received from the ranging electronics. By way of example, the time interval counter may count from 0 to 99 with each count representing 1 millisecond and when the count reaches 99, it operates a one-shot pulse generator to thereby provide a pulse signal which constitutes a down range signal to the ranging electronics. If $t$ expires before a count of 99 is reached, the counter is reset, the pulse generator is not operated, and no down range signal is provided to the ranging electronics.

The oscillators and mixer cooperate with the time interval counter to effect further control of the abrasive flow controller 49. Assuming that resonator frequency is substantially low, then following closing of the start switch 54 the crystal position controller provides a signal to the abrasive flow controller which causes relatively high flow of abrasive particles to maintain the abrasive stream 27 in a highly abrasive state. The abrasive flow controller may be controlled by relays (not shown) which are driven by drivers which are responsive to signals from the logic circuit. The flow of abrasive is shut down if the vibrations of the resonator 11 are dampened substantially. The amplitude of the sign wave signal representing $f_i$ which is supplied to the mixer by the tuning oscillator represents the amplitude of the vibrations of the resonator. If the amplitude of this signal is above a predetermined level, the mixer supplies a signal to an AND gate 57 to enable the AND gate to thereby allow the 1,000 Hz signal to be applied to the time interval counter. In addition, this signal from the mixer to the AND gate 57 also enables the abrasive flow controller 49. If the amplitude of the signal representing $f_i$ drops below a preselected value, no signal is provided to the AND gate 57, and the abrasive flow controller 49 is inhibited.

The ranging electronics is responsive to a divisor of 10 being selected to provide a signal to the abrasive flow controller 49 which switches the abrasive flow controller from high to medium abrasive flow.

Whenever $t$ reaches 70 milliseconds, a binary signal is supplied by the time interval counter to an AND gate 59. The signal to the AND gate 59 may be supplied by a one-shot pulse generator which is responsive to the count reaching 70. A binary signal is also fed to the AND gate 59 from the ranging electronics in response to a selection of the divisor 1. This enables the AND gate 59 to spply a signal to the abrasive flow controller to operate appropriate relays to switch the latter from medium to low abrasive flow. This may occur, for example, when $\Delta f_i$ is less than 14 Hz or only about 4 Hz away from being tuned.

If, when the resonator 11 is first mounted on the resonator holder, the frequency of the resonator is at or above the tuned range, the time interval counter and the ranging electronics will cooperate as described above to select a divisor of 1, and in response thereto the ranging electronics provides a binary signal to an AND gate 61. If $t$ is equal to or greater than 100 milliseconds, the time interval counter also provides a signal to the AND gate 61 to enable the gate to provide a signal to the crystal status electronics which in turn illuminates a light 55 indicating that the resonator 11 should be removed from the holder 23. After the start switch 54 is depressed, if no pulse is received from the AND gate 61 in a preset time, then a flip flop within the crystal status electronics is set which establishes a tune crystal signal or a start signal which is transmitted to the crystal position controller.

A time signal representing *t*, which may be in the form of a square wave, is fed to a rate monitor, and the rate monitor is responsive to this signal to control the direction of the incrementing feed motor 33. If the initial status check of the resonator 11 shows that the crystal is not at or above the tuned frequency, the crystal status electronics provides tune crystal signals to the crystal position controller and to the crystal feed controller as indicated above to thereby cause the positioning motor 31 and the incrementing feed motor 33 to be energized in a forward direction. This advances the table 29 and the resonator holder 23 toward the abrasive stream 27. As indicated above, when the table 29 reaches the operating position, it closes a limit switch 53 which causes the crystal position controller to de-energize the positioning motor 31. The feed motor 33, however, advances the resonator holder 23 and in particular the crystal plate 12 toward and into the abrasive stream 27. As the length of the crystal plate 12 is reduced by the abrasive stream 27, the frequency change is monitored by the rate monitor.

Although the rate monitor may take several forms, in one form it includes an analog frequency monitor circuit which converts each of the time signals *t* to a proportional voltage. The circuit then compares proportional voltages derived from successive times *t*. Specifically, the most recently obtained voltage is rated at, for example, 98 percent or 99 percent and then compared to the full value or 100 percent of the preceding proportional voltage. In this manner the tuning rate as a function of $\Delta f_i$ per 0.2 second is determined.

If the weighted value of the most recent proportional voltage is less than the immediately preceding proportional voltage, the rate monitor provides a signal to the crystal feed controller which in turn causes the incrementing feed motor 33 to continue to advance the resonator 11 into the abrasive stream 27. Conversely, the incrementing feed motor 33 is reversed if the weighted value of the most recent proportional voltage exceeds the immediately prior proportionate voltage. Any suitable two state output can be included in the rate monitor to indicate to the crystal feed controller whether the rate of frequency change is excessive.

The rate monitor can operate at a fast or slow tuning rate which may be, for example, 2 percent $\Delta f_i/0.2$ second and 1 percent $\Delta f_i/0.2$ second, respectively. The slow rate is selected by appropriate logic if either an approach signal or a low tune signal is received. The fast rate is selected in the absence of either of these signals. Initially an approach signal is provided to the rate monitor by the crystal feed controller. When the tuning rate reaches 1 percent $\Delta f_i$ per 0.2 second, it provides a signal to the crystal feed controller which reverses the incrementing feed motor 33.

Specifically, the rate monitor may provide a binary 1 to the crystal feed controller so long as the tuning rate in the approach mode is under 1 percent. When the tuning rate exceeds 1 percent, a binary 0 is transmitted to the crystal feed controller to reverse the feed motor 33 and to select the servo-rate. Thus, the crystal feed controller is shifted in response to this first reversing signal from the approach mode to the servocontrol mode.

In the servo-mode the approach signal to the rate monitor is interrupted whereupon the latter shifts to allow the 2 percent tuning rate. In the servocontrol mode, the crystal feed controller causes the incrementing feed motor 33 to move more slowly than in the approach mode. Thereafter, if the 2 percent tuning rate is exceeded, the rate monitor initiates a reverse command to the crystal feed controller which in turn reverses the incrementing feed motor 33 to move the resonator holder 23 and the resonator 11 to withdraw the crystal plate 12 from the abrasive stream 27. When the tuning rate drops to 2 percent or less, the rate monitor senses this change and causes the feed motor 33 to move in the forward direction again.

It may be advantageous to reduce the tuning rate, i.e., reduce the percent of $\Delta f_i$ at which the tuning operation is carried out when $\Delta f_i$ is reduced to a predetermined value such as 14 Hz. To accomplish this, a low tune signal is supplied to the rate monitor when the AND gate 59 is enabled whereupon the rate monitor selects the 1 percent tuning rate.

The feed motor 33 is preferably a stepping motor. The crystal feed controller receives timing signals which control the stepping rate of the feed motor 33. Preferably the feed controller includes appropriate logic which allows the feed rate of the motor 33 to be manually selected, and it may also include logic which causes the motor in any given mode to step more rapidly in the reverse direction than in the forward direction. It also contains logic for selecting the stepping rates for the approach and servo-modes. Thus, the rate monitor determines only the direction of the feed motor 33 and the crystal feed controller determines the mode of operation and the stepping rate.

As described above, the AND gate 61 is enabled when the resonator 11 is tuned and a signal is provided to the crystal status electronics. The crystal status electronics then provides a signal to an OR gate 63. This enables the OR gate which provides a reverse position signal to the crystal position controller and a similar signal to the crystal feed controller whereupon the motors 31 and 33 are driven in the reverse directions to place the table 29 and the resonator 11 in the load position. In addition, the output from the OR gate 63 provides a stop abrasion signal to the abrasive flow controller 49 whereupon the abrasive stream 27 is discontinued.

When the table 29 reaches the load position, it closes the limit switch 51 and this causes the crystal position controller to de-energize the positioning motor 31. When the crystal holder 23 reaches a fully retracted postion, it closes a limit switch 65 and this causes the crystal feed controller to de-energize the incrementing feed motor 33.

The crystal position controller provides a load position signal to an AND gate 67 when the table 29 is in the load position. Similarly, the crystal feed controller provides a retracted position signal to the AND gate 67 when the limit switch 65 is closed. This enables the AND gate 67 and illuminates a lamp 69 to thereby indicate that the resonator 11 has been tuned and can be removed from the resonator holder 23. The crystal tuner 21 can be stopped manually by closing a stop switch 71 whereupon the OR gate 63 is enabled in the same manner as described hereinabove.

As an alternative, the rate monitor may provide for brief termination of the abrasive action on the resonator 11 and making the frequency calculation when abrasive action is stopped. When this procedure is followed, there are no external factors which might tend to effect the frequency calculation. To accomplish this the rate monitor may have a timing circuit which is turned on in response to the low tune signal to the rate monitor. The timing circuit may include a counter which counts each time signal *t* which is received from the time interval counter. This counter causes the abrasive flow controller 49 to be turned off at one count of the counter and to be turned on again at a subsequent count. The interval during which the abrasive flow controller does not operate must be sufficient to allow the rate monitor to determine the tuning rate.

Although an exemplary embodiment of the invention has been shown and described, many changes, modifications and substitutions may be made by one having ordinary skill in the art without necessarily departing from the spirit and scope of this invention.

We claim:

1. A method of changing the resonant frequency of a resonator comprising:

relatively advancing the resonator and a stream of abrasive particles toward each other and into contact to abrasively reduce a dimension of the resonator and to increase the resonant frequency of the resonator;

monitoring the frequency of the resonator while said dimension of the resonator is being reduced and without terminating said stream to provide a signal related to the frequency of the resonator;

processing the signal with control equipment to provide resonant frequency information; and controlling the relative advance of the resonator and the stream of abrasive particles in accordance with the resonant frequency information to thereby control the resonant frequency of the resonator.

2. The method set forth in claim 1 including controlling the abrasiveness of said stream of abrasive particles in accordance with the resonant frequency information.

3. A method as defined in claim 1 wherein the resonator includes a piezoelectric crystal plate having a generally planar end face and said stream is directed against said end face at an acute angle relative thereto to reduce the length of the crystal plate.

4. A method as defined in claim 1 wherein said step of controlling includes controlling the relative advance of the resonator and the abrasive particles to prevent the tuning rate from exceeding a predetermined tuning rate and relatively moving the resonator and the abrasive particles so as to retract the resonator from the abrasive particles when the tuning rate exceeds said predetermined tuning rate.

5. A method as defined in claim 1 wherein the resonant frequency information includes the tuning rate, said tuning rate being a predetermined percent of the difference between a reference frequency and the instantaneous frequency of the resonator.

6. A method as defined in claim 1 including reducing the density of abrasive particles in the stream as the resonant frequency of the resonator is increased.

7. The method set forth in claim 4 wherein the tuning rate is reduced when said difference is reduced to a predetermined value.

8. The method set forth in claim 4 wherein said step of monitoring is carried out continuously and said step of processing includes electronically computing said tuning rate a plurality of times each second.

9. The method set forth in claim 8 wherein the resonator includes a piezoelectric crystal plate having a generally planar end face and said stream is directed against said end face at an acute angle relative thereto to reduce the length of the crystal plate, and including reducing the density of the abrasive particles in the stream as the resonant frequency of the resonator is increased.

10. The method set forth in claim 1 wherein said step of monitoring is carried out continuously and said step of processing is carried out a plurality of times per second.

11. A method of changing the resonant frequency of a resonator comprising:

relatively advancing the resonator and a stream of abrasive particles toward each other and into contact to abrasively reduce a dimension of the resonator and to increase the resonant frequency of the resonator;

monitoring the frequency of the resonator to provide a signal related to the frequency of the resonator;

electronically processing the signal to provide resonant frequency information;

controlling the relative advance of the resonator and the stream of abrasive particles in accordance with the resonant frequency information to thereby control the resonant frequency of the resonator, the step of controlling the relative advance including controlling the rate of said relative advance; and controlling the abrasiveness of the stream in accordance with the resonant frequency information.

12. The method as defined in claim 11 wherein the resonator includes a piezoelectric crystal plate having a generally planar end face and said stream is directed against said end face at an acute angle relative thereto to reduce the length of the crystal plate.

13. A method of changing the resonant frequency of a resonator having a generally planar end face comprising:

relatively advancing the resonator and the stream of abrasive particles toward each other and into contact to abrasively reduce the length of the resonator and to increase the resonant frequency of the resonator;

said stream of abrasive particles forming an acute angle with said end face;

monitoring the frequency of the resonator to provide a signal related to the frequency of the resonator, electronically processing the signal to provide resonant frequency information; and controlling the relative advance of the resonator and the stream of abrasive particles in accordance with the resonant frequency information to thereby control the resonant frequency of the resonator, the step of controlling including controlling the rate of said relative advance.

* * * * *